US010766402B2

(12) United States Patent
Albou et al.

(10) Patent No.: US 10,766,402 B2
(45) Date of Patent: Sep. 8, 2020

(54) LIGHTING MODULE HAVING LIGHT-EMITTING ELEMENTS WITH GRADUAL CUTOFF

(71) Applicant: Valeo Vision, Bobigny (FR)

(72) Inventors: Pierre Albou, Bobigny (FR); Vincent Godbillon, Bobigny (FR); Jean-Claude Puente, Bobigny (FR)

(73) Assignee: Valeo Vision, Bobigny (FR)

( * ) Notice: Subject to any disclaimer, the term of this patent is extended or adjusted under 35 U.S.C. 154(b) by 0 days.

(21) Appl. No.: 16/229,597

(22) Filed: Dec. 21, 2018

(65) Prior Publication Data

US 2019/0193624 A1    Jun. 27, 2019

(30) Foreign Application Priority Data

Dec. 22, 2017 (FR) ...................... 17 63083

(51) Int. Cl.
| | |
|---|---|
| *B60Q 1/14* | (2006.01) |
| *H01L 33/38* | (2010.01) |
| *F21S 41/141* | (2018.01) |
| *F21S 41/19* | (2018.01) |
| *F21S 41/155* | (2018.01) |
| *F21S 41/143* | (2018.01) |
| *H01L 33/08* | (2010.01) |
| *F21W 102/135* | (2018.01) |
| *F21S 41/255* | (2018.01) |

(Continued)

(52) U.S. Cl.
CPC .......... *B60Q 1/1423* (2013.01); *F21S 41/141* (2018.01); *F21S 41/143* (2018.01); *F21S 41/155* (2018.01); *F21S 41/19* (2018.01); *H01L 33/387* (2013.01); *F21S 41/255* (2018.01); *F21W 2102/135* (2018.01); *F21Y 2105/12* (2016.08); *F21Y 2105/14* (2016.08); *H01L 33/08* (2013.01)

(58) Field of Classification Search
CPC .......... B60Q 1/14; H01L 33/38; F21S 41/141; F21S 41/19
See application file for complete search history.

(56) References Cited

U.S. PATENT DOCUMENTS

| | | |
|---|---|---|
| 4,985,816 A | 1/1991 | Seko et al. |
| 2011/0215369 A1 | 9/2011 | Brick et al. |
| 2016/0033102 A1 | 2/2016 | Hiratsuka et al. |

FOREIGN PATENT DOCUMENTS

| | | |
|---|---|---|
| DE | 10 2008 054 218 A1 | 5/2010 |
| EP | 2 979 923 A1 | 2/2016 |
| FR | 3 039 881 A1 | 2/2017 |

(Continued)

OTHER PUBLICATIONS

French Preliminary Search Report dated Aug. 14, 2018 in French Application 17 63083, filed on Dec. 22, 2017 ( with english translation of Categories of Cited Documents).

*Primary Examiner* — Joseph L Williams
(74) *Attorney, Agent, or Firm* — Oblon, McClelland, Maier & Neustadt, L.L.P.

(57) ABSTRACT

A light-emitting module of a lighting/signalling device, in particular for a motor vehicle, including at least one light source including a set of submillimetre-sized light-emitting elements; the light-emitting elements being distributed in a first zone and in a second zone such that the first zone emits a first luminous intensity and that the second zone provides a transition between the first luminous intensity in proximity to the first zone and a second luminous intensity that is lower than the first luminous intensity.

20 Claims, 3 Drawing Sheets

(51) Int. Cl.
*F21Y 105/14* (2016.01)
*F21Y 105/12* (2016.01)

(56) References Cited

FOREIGN PATENT DOCUMENTS

| | | |
|---|---|---|
| FR | 3 048 845 A1 | 9/2017 |
| JP | 2011-249183 | 12/2011 |

LIGHTING MODULE HAVING LIGHT-EMITTING ELEMENTS WITH GRADUAL CUTOFF

The present application relates to the field of lighting modules and, in particular, to those for lighting/signalling in a motor vehicle.

The term "lighting module" is understood to mean any device capable of emitting light, in particular for lighting and/or signalling in motor vehicles.

Such a lighting module incorporates a light source for this purpose. The light sources used for lighting and signalling in motor vehicles are increasingly commonly made up of light-emitting diodes, in particular to gain advantages in terms of bulk and of autonomy in comparison with conventional light sources. The use of light-emitting diodes in lighting and/or signalling modules has furthermore enabled market players (motor vehicle manufacturers and lighting and/or signalling device designers) to add a creative touch when designing these devices, in particular for the use of an ever-increasing number of these light-emitting diodes so as to produce optical effects.

The light source may have two distinct sets of light-emitting diodes, each set being contained within a given zone of the source, the two zones being separated by a cutoff.

With reference to FIG. 1, two zones 101 and 102 of a light source 100 according to the prior art, the zones 101 and 102 being separated by a cutoff 103, for illumination in a direction perpendicular to the plane of FIG. 1 are shown.

The zones 101 and 102 can be addressed individually so that multiple lighting functions may be performed using the same source.

By way of example, the light source 100 is able to perform:
- a low-beam function, when only the one or more diodes of the zone 101 are lit, the diodes of the zone 102 being off;
- a high-beam function, when the diodes of the zones 101 and 102 are lit.

However, regulatory constraints tend to impose a cutoff 103 between the zones 101 and 102 that is more or less sharp.

In particular, a European regulation imposes a very high luminosity gradient, in the case of a low beam, between the light zone 101 and the dark zone 102, while an American regulation imposes a more gradual gradient between the two zones.

There is thus a need to produce a transition in luminous intensity between a dark zone and a light zone in the context of a lighting function, such as a low-beam function.

The present invention improves the situation.

A first aspect of the invention relates to a light-emitting module of a lighting/signalling device, in particular for a motor vehicle, comprising:
- at least one light source comprising a set of submillimetre-sized light-emitting elements;

the light-emitting elements being distributed in a first zone and in a second zone such that the first zone emits a first luminous intensity and that the second zone provides a transition between the first luminous intensity in proximity to the first zone and a second luminous intensity that is lower than the first luminous intensity.

The light-emitting elements are grown from a common substrate and are electrically connected such that they can be activated selectively, individually or per subset of emissive elements. The configuration of what is termed a "monolithic" light source such as this allows pixels that can be activated selectively to be arranged very closely to one another with respect to conventional light-emitting diodes, which are intended to be soldered onto printed circuit boards.

The use of submillimetre-sized light-emitting elements in a light source both allows these elements potentially to be supplied with power individually and their small size allows pixelated lighting functions to be performed at high resolution, in particular a lighting transition in the context of a transition in a cutoff zone of a low beam.

According to one embodiment, the light-emitting elements may be submillimetre-sized light-emitting pads and/or rods.

A rod shape allows the areal density of light-emitting elements, and thus the luminous intensity delivered by the light source, to be increased.

According to one embodiment of the invention, the set of light-emitting elements may comprise a first set of light-emitting elements and a second set of light-emitting elements, the light-emitting elements of the first set may be supplied with power at a first electrical intensity value by a control circuit and at least two light-emitting elements of the second set may be supplied with power by the control circuit at distinct respective luminous intensity values so as to produce said transition.

It is thus made possible to produce a luminous intensity gradient in the second zone by arranging subsets of light-emitting elements that are supplied with power by distinct currents.

In addition, the electrical power supply of the light-emitting elements of the second set may be controlled by the control circuit in such a way as to modify a luminous intensity gradient of the transition.

The light intensity gradient of the transition is thus not static and may be reconfigured. One and the same light-emitting module may thus be used in multiple countries having different regulatory constraints.

Also in addition, the light-emitting module may further comprise a human-machine interface that is configured to drive the control circuit in such a way as to modify a luminous intensity gradient of the transition.

Thus, the user, such as the driver, may modify the luminous intensity gradient of the transition him- or herself according, for example, to the country in which he or she is located.

According to one embodiment, the second zone comprises at least a first sub-zone and a second sub-zone that are distinct from one another, the first sub-zone being closer to the first zone than the second sub-zone, and wherein a first density of light-emitting elements in the first sub-zone is higher than a second density of light-emitting elements in the second sub-zone, so as to provide the transition between the first luminous intensity and the second luminous intensity.

Thus, in complement to the variation in the current delivered to the light-emitting elements of the second set, or as an alternative, the invention envisages varying the density of light-emitting elements in the various sub-zones. When this embodiment is an alternative, it makes it possible to avoid using a complex control circuit, the light-emitting elements of the second set being able to be supplied with power by the same current, since the transition is produced by the various densities of light-emitting elements.

According to one embodiment, the light-emitting elements may further be distributed in a third zone, the second zone being at least partially located between the first zone and the third zone, and the third zone may emit a third luminous intensity that is equal to or lower than the second luminous intensity.

The lighting transition is thus provided between two zones. For example, the third zone may be dark in a low-beam configuration and lit in a high-beam configuration.

A second aspect of the invention relates to a lighting device, in particular for a motor vehicle, comprising a light-emitting module according to the first aspect of the invention.

Other features and advantages of the invention will emerge upon examining the following detailed description and the appended drawings, in which.

The present invention advantageously makes use of submillimetre-sized light-emitting elements. Specifically, these elements both are potentially able to be addressed individually and their size allows pixelated lighting functions to be performed at high resolution.

By way of example, the submillimetre-sized light-emitting elements may be submillimetre-sized light-emitting rods, as illustrated with reference to FIGS. 2 and 3.

Figure 2:
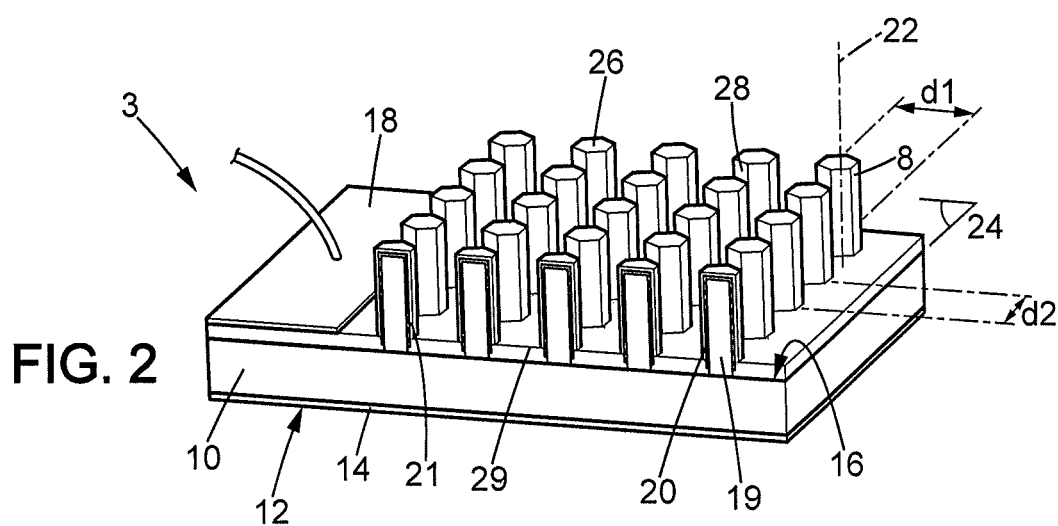
FIG. 2 illustrates light-emitting elements of a light source according to one embodiment.

FIG. 2 illustrates a set of light-emitting elements according to one embodiment of the invention.

Figure 4:
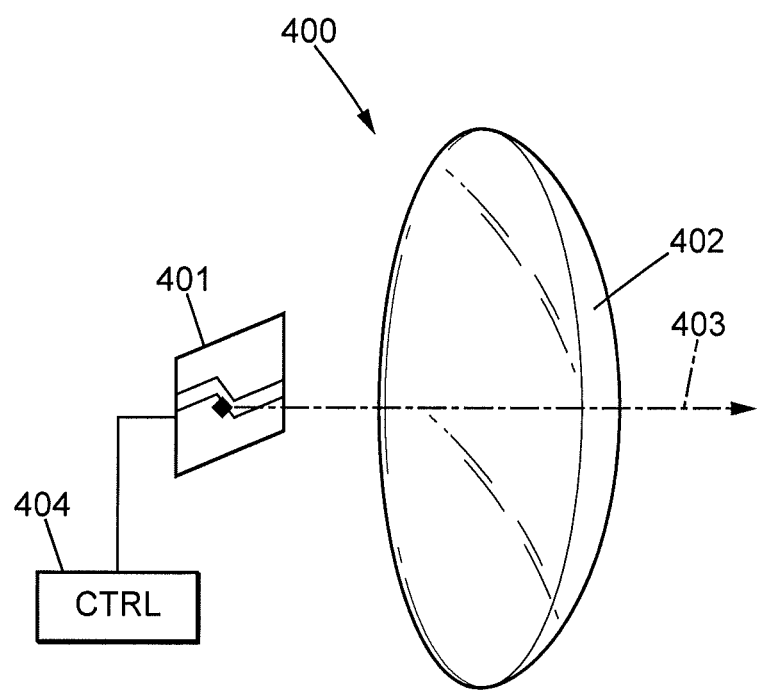
FIG. 4 shows a lighting module according to one embodiment of the invention.

In FIG. 4, by way of example, the light-emitting elements are submillimetre-sized light-emitting rods 8, which will be referred to hereinafter as light-emitting rods. These light-emitting rods 8 originate on one and the same substrate 10. Each light-emitting rod 8, formed in this case using gallium nitride GaN, extends perpendicularly, or substantially perpendicularly, projecting from the substrate 10, in this case produced based on silicon, with other materials, such as silicon carbide, being able to be used for the substrate without departing from the context of the invention. By way of example, the light-emitting rods 8 could be produced from a compound based on aluminium nitride and gallium nitride AlN/GaN, or from a compound based on aluminium, indium and gallium AlN/GaN/InGaN.

In FIG. 2, the substrate 10 has a lower face 12, to which a first electrode 14 is applied, and an upper face 16, from which the light-emitting rods 8 project and to which a second electrode 18 is applied.

It should be noted that only one subset of light-emitting rods 8 is shown in FIG. 4, and that the light-emitting source according to the invention comprises a plurality of subsets as described in detail below.

In particular, as described in detail below, the set of light-emitting elements may comprise at least a first set and a second set, the second set being able to comprise a plurality of subsets of at least one light-emitting element. In this case, one or more electrodes 14 and 18 may be dedicated to one and the same subset, such that each subset is able to be supplied with power individually, i.e. independently of the other subsets.

Various layers of material may be stacked on the upper face 16, in particular after the light-emitting rods have grown from the substrate.

Among these various layers may be found at least one layer of electrically conductive material, so as to allow the light-emitting rods 8 to be supplied with electrical power. This layer is etched in such a way as to link the rods of each individually addressable subset to one another.

The submillimetre-sized light-emitting rods 8 extend from the substrate 10 and each includes, as may be seen in FIG. 2, a core 19 made of gallium nitride, arranged around which are quantum wells 20 formed by a radial stacking of layers of different materials, in this case gallium nitride and gallium-indium nitride, and a shell 21, also made of gallium nitride, surrounding the quantum wells.

Each rod extends along a longitudinal axis 22 defining its height, the base 23 of each rod being arranged in a plane 24 of the upper face 16 of the substrate 10.

The light-emitting rods 8 may advantageously take the same shape. These light-emitting rods 8 are each delineated by an end face 26 and by a circumferential wall 28 that extends along the longitudinal axis. When the light-emitting rods 8 are doped and biased, the resulting light at the output of the light source 100 is emitted mainly from the circumferential wall 28, it being understood that it may be provided that at least a small amount of luminous radiation also exits from the end face 26. The result of this is that each light-emitting rod 8 acts as a single light-emitting diode, and that the density of the light-emitting rods 8 increases the luminance of the light source 100.

The circumferential wall 28 of a light-emitting rod 8, corresponding to the gallium nitride shell, may be covered with a layer of transparent conductive oxide (TCO) 29 that forms the anode of each light-emitting rod, complementary to the cathode formed by the substrate.

This circumferential wall 28 may extend along the longitudinal axis 22 from the substrate 10 as far as the end face 26, the distance from the end face 26 to the upper face 16 of the substrate, from which the light-emitting rods 8 originate, defining the height of each light-emitting rod 8. By way of example, it may be provided that the height of a light-emitting rod 8 is between 1 and 10 micrometres, whereas it may be provided that the largest transverse dimension of the end face, perpendicular to the longitudinal axis 22 of the light-emitting rod in question, is less than 2 micrometres.

It may also be provided to define the surface area of a light-emitting rod 8, in a sectional plane perpendicular to this longitudinal axis 22, to be within a determined range of values, and in particular between 1.96 and 4 square micrometres.

These dimensions, which are given by way of nonlimiting example, make it possible to differentiate a light source 100 comprising submillimetre-sized light-emitting elements from a light source with planar light-emitting diodes.

It would also be possible to provide other particular dimensions for the light source 100 according to the invention, and in particular a size of the lighting surface of at most $10 \times 10$ mm$^2$, for example. The density of the light-emitting rods 8 and the area of the lighting surface may further be calculated such that the luminance achieved by the plurality of light-emitting rods is at least 60 Cd/mm$^2$, for example. One embodiment of the invention is based in particular on a variable density of light-emitting elements, as described in detail below.

The height of the light-emitting rods 8 may also be modified within the light source 100, such that the height of some light-emitting rods may differ from that of other light-emitting rods.

The shape of the light-emitting rods 8 may also vary, in particular in terms of the cross section of the rods and in terms of the shape of the end face 26. FIG. 2 illustrates light-emitting rods having a cylindrical general shape, and in particular with a polygonal cross section, more particularly hexagonal in this case. It is understood that it is important, for light to be able to be emitted through the circumferential wall, that the latter has a polygonal or circular shape, for example.

Figure 3:
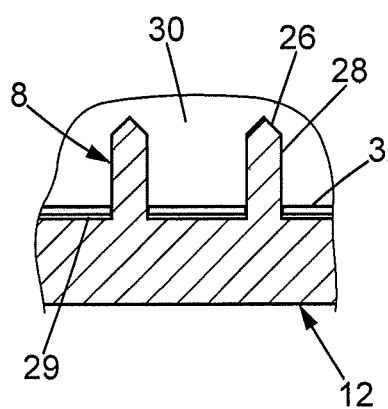
FIG. 3 is a sectional view of a light source of a lighting module according to one embodiment.

Moreover, the end face 26 may have a shape that is substantially planar and perpendicular to the circumferential wall, such that it extends substantially parallel to the upper face 16 of the substrate 10, as illustrated in FIG. 2, or else it may have a curved or pointed shape at its centre, so as to multiply the directions in which the light exiting this end face is emitted, as illustrated in FIG. 3.

In FIG. 3, the light-emitting rods 8 are arranged in a two-dimensional array, constituting one subset. Such a subset may for example correspond to a pixel of the projected image, and the light source 100 may thus comprise a plurality of subsets corresponding to respective pixels. A subset comprises at least one light-emitting element 8.

This arrangement may be such that the light-emitting rods are arranged in quincunx. The invention covers other distributions of the rods, having in particular rod densities that may vary from one subset to the next.

The light source 100 may furthermore comprise, as illustrated in FIG. 3, a layer 30 of a polymer material in which light-emitting rods 8 are at least partially embedded. The layer 30 may thus extend over the entire extent of the substrate, or just around one subset or set only.

The polymeric material, which may in particular be silicone-based, makes it possible to protect the light-emitting rods 8 without impairing the diffusion of the light rays.

It is generally possible to incorporate, into this layer 30 of polymer material, wavelength conversion means, for example luminophores, that are able to absorb at least a portion of the radiation emitted by one of the light-emitting rods 8 and to convert at least a portion of the absorbed excitation light into a light emission having a wavelength that is different from that of the excitation light.

The light source 100 may furthermore include a coating 32 of light-reflective material that is arranged between the light-emitting rods 8 so as to deflect the rays, which are initially oriented towards the substrate 10, towards the end face 26 of the light-emitting rods 8. In other words, the upper face 16 of the substrate 10 may include a reflective means that returns the light rays, which are initially oriented towards the upper face 16, towards the output face of the light source 100. Rays that would otherwise be lost are thus recovered. This coating 32 may be arranged between the light-emitting rods 8 on the layer of transparent conductive oxide 29.

FIG. 4 shows a light-emitting module 400 according to one embodiment of the invention. Such a light-emitting module may be incorporated within a lighting/signalling device, such as a headlamp, in particular in a motor vehicle.

The light-emitting module comprises a light source 401 comprising a set of submillimetre-sized light-emitting elements. According to the invention, the light-emitting elements 8 are distributed in a first zone and in a second zone of the light source, such that the first zone emits a first luminous intensity and that the second zone provides a transition between the first luminous intensity in proximity to the first zone and a second luminous intensity that is lower than the first luminous intensity.

Figure 1:
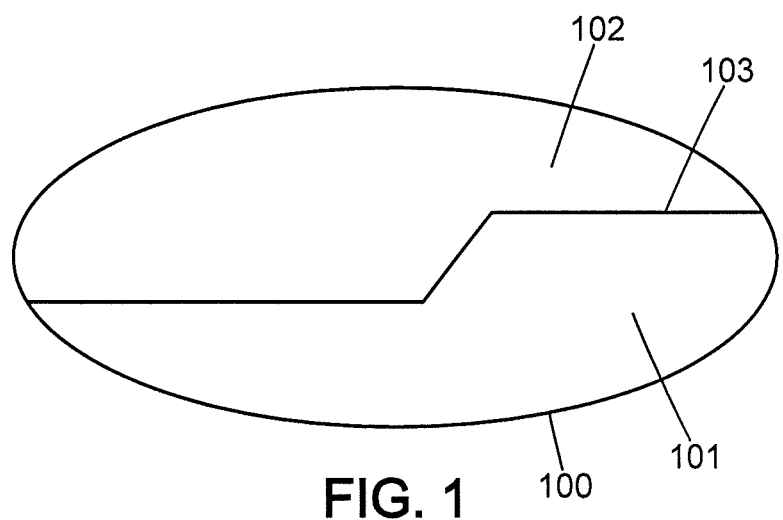
FIG. 1 illustrates a light source according to the prior art.

The first zone in question may correspond to the zone 101 of the prior art illustrated in FIG. 1. However, the invention further provides a transition zone so that the luminous intensity is gradually decreased from the intensity of the first zone. For example, the luminous intensity may be decreased down to the second luminous intensity, which may correspond to a maximum luminous intensity of a third zone, which may correspond to the zone 102 of the prior art illustrated in FIG. 1. The addition of a third zone is optional according to the invention.

For example, the ratio R of the first luminous intensity to the second luminous intensity, or luminous intensity gradient, may be set or adjusted according to regulatory constraints.

For example, in Europe, regulatory constraints dictate that R be at least equal to 16.2. In the United States, regulatory constraints dictate that R be between 10.8 and 88.9.

The distribution of the submillimetre-sized light-emitting elements allows such a transition to be produced. Two embodiments of the distribution of the light-emitting elements are described with reference to FIGS. 5 and 6.

The light-emitting module 400 may further comprise a shaping optic making it possible to focus the light rays coming from the light source 401 in the direction of an optical axis 403. The light-emitting module may further comprise a control circuit 404, which is described in detail below.

Figure 5:
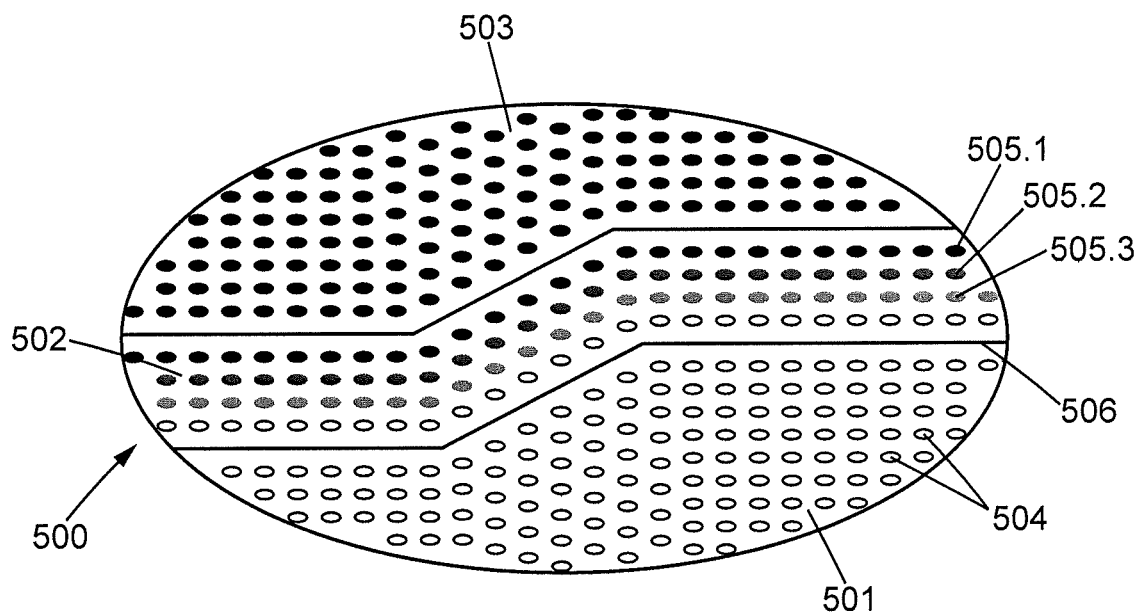
FIG. 5 shows a light source of a lighting module according to a first embodiment of the invention.

FIG. 5 illustrates a light source 500 of a light-emitting module according to a first embodiment of the invention.

According to the first embodiment, the light source 500 comprises a first set and a second set of light-emitting elements, which are distributed in a first zone 501 and a second zone 502. By way of illustration, a third set of light-emitting elements may be in a third zone 503, as illustrated in FIG. 5.

In the first embodiment, the first and second sets are distributed in distinct respective zones, delimited by the boundary 506. The light-emitting elements of the first set are thus included within the first zone 501 and the light-emitting elements of the second set are included within the second zone 502, the first zone and the second zone being separated by the boundary 506. The invention may however make provision for at least some light-emitting elements of the first and of the second set to be intermixed, i.e. the intersection of the first zone 501 and of the second zone 502 not being a zero set.

The first set comprises the light-emitting elements 504 that are distributed in the first zone 501. The light-emitting elements 504 are configured and supplied with power such that the first zone emits at the first luminous intensity. In the case in which the luminous intensity varies within the first zone, the first luminous intensity preferably corresponds to the luminous intensity emitted by the light-emitting elements of the first zone 501 in proximity to the boundary 506.

According to the first embodiment of the invention, the light-emitting elements of the second set are supplied with power at distinct respective luminous intensity values so as to produce the transition between the first luminous intensity and the second luminous intensity.

To this end, the light-emitting elements of the second set may be distributed in various subsets of at least one light-emitting element, each subset being able to be addressed individually, i.e. the subsets of light-emitting elements are supplied with power independently of one another.

For example, the light-emitting element 505.1 and the light-emitting element 505.2 may belong to two distinct subsets and may thus be supplied with power independently. Thus, the light-emitting element 505.1, being further from the boundary 506 than the element 505.2, may emit a luminous intensity that is lower than the luminous intensity emitted by the light-emitting element 505.2. For example, since the light-emitting element 505.1 is located at the boundary with the third set 503, the light-emitting element 505.1 may emit at the second luminous intensity.

Furthermore, the light-emitting element 505.3 may belong to a third subset. Being located in proximity to the boundary 506, the light-emitting element 505.3 may emit at the first luminous intensity.

According to an additional embodiment, the respective luminous intensities emitted by the various subsets of light-emitting elements of the second set may be controlled and modified by the control circuit 404. This thus makes it possible to produce different transitions, also referred to as "cut-off blurring", that are more or less gradual between the first luminous intensity and the second luminous intensity. For example, the transition may be adjusted when the motor vehicle crosses into a country having different regulatory constraints for lighting.

The control circuit 404 may for example be driven by a human-machine interface (not shown in the figures) that can be accessed by the driver of the motor vehicle. The driver may thus adjust the graduality, or intensity gradient, of the transition. To this end, he or she may set a cutoff blurring value, for example in terms of percentage, between 0 and 100%. Such a value is next interpreted by the control circuit 404 in order to adjust the currents supplying power to the various subsets of the second set of light-emitting elements.

The control circuit 404 may further be used to adjust the currents supplying power to the subsets of the second set 502 in a process of calibrating the lighting/signalling device.

The delivered power supply currents may for example follow a decreasing affine law according to the distance from the boundary 506 with the first zone 501.

Figure 6:
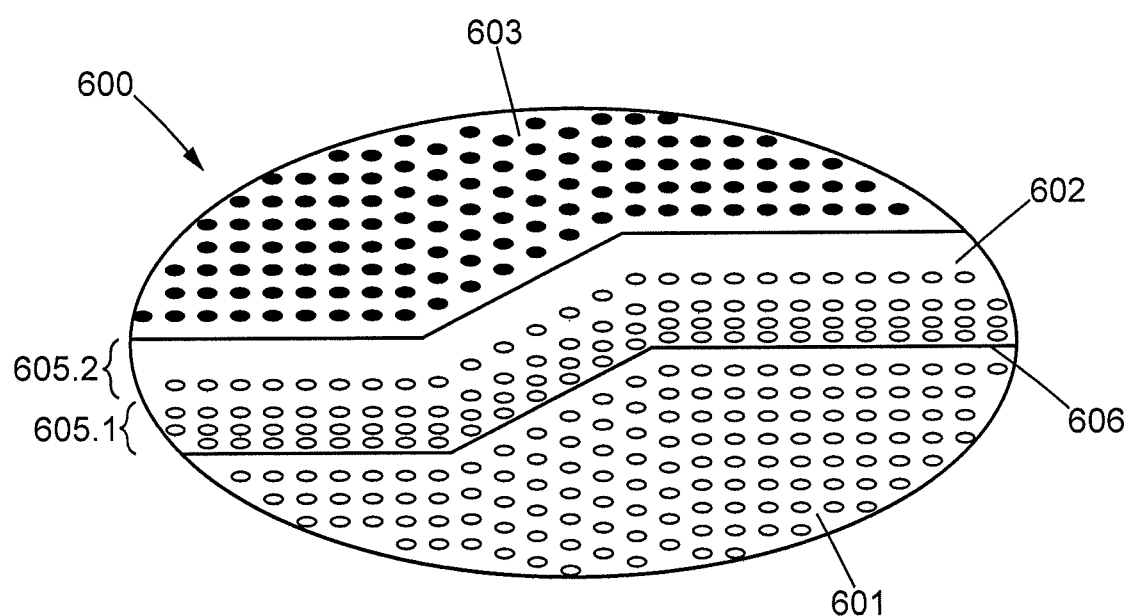
FIG. 6 shows a light source of a lighting module according to a second embodiment of the invention.

FIG. 6 illustrates a light source 600 of a light-emitting module according to a second embodiment of the invention.

As for the first embodiment, the set of light-emitting elements comprises at least a first set and a second set, which are distributed in a first zone 601 and a second zone 602. In addition, and optionally, the light source 600 may comprise a third set of light-emitting elements in a third zone 603, as explained above for the first embodiment.

As for the first embodiment, the light-emitting elements of the first set are grouped together in the first zone and the light-emitting elements of the second set are grouped together in the second zone 602, the first zone and the second zone being delimited by a boundary 606.

As explained above, the light-emitting elements of the first and second sets may be intermixed such that the zones overlap.

Unlike in the first embodiment, the transition between the first intensity and the second intensity is produced by distributing the light-emitting elements of the second set 602 in such a way as to vary the density of light-emitting elements. For example, the light-emitting elements are at least grouped together in a first sub-zone 605.1 comprising a first density of elements, and in a second sub-zone 605.2 comprising a second density of elements. Since the first sub-zone 605.1 is closer to the first zone 601, the first density of elements is higher than the second density of elements. Of course, the light-emitting elements of the second set may be grouped together in more than two sub-zones, so as to make the transition more gradual.

The light-emitting elements of the first sub-zone 605.1 and the light-emitting elements of the second sub-zone 605.2 may belong to one and the same subset, i.e. they are supplied with power by the same power supply current. In this case, the variation in the density of elements alone determines the resolution and the gradient of the transition between the first intensity and the second intensity.

As a variant, the elements of the first sub-zone 605.1 and the light-emitting elements of the second sub-zone 605.2 may belong to distinct subsets, so as to be supplied with power independently. In this case, the variation in the density of elements and the various currents for supplying power to the subsets of elements determine the resolution and the gradient of the transition between the first intensity and second intensity. According to this variant, the second embodiment is thus combined with the first embodiment.

Of course, the invention is not limited to the embodiments described above and provided solely by way of example. It encompasses numerous modifications, alternative forms and other variants able to be contemplated by those skilled in the art within the context of the present invention, and in particular any combination of the various embodiments described above.

The invention claimed is:

1. A light-emitting module of a lighting/signalling device for a motor vehicle, the light-emitting module comprising:
   at least one light source comprising a set of submillimetre-sized light-emitting elements;
   the light-emitting elements being distributed in a first zone and in a second zone such that the first zone emits a first luminous intensity and that the second zone provides a transition between the first luminous intensity in proximity to the first zone and a second luminous intensity that is lower than the first luminous intensity,
   wherein the second zone comprises at least a first sub-zone and a second sub-zone that are distinct from one another, a first density of light-emitting elements in the first sub-zone being higher than a second density of light-emitting elements in the second sub-zone.

2. The light-emitting module according to claim 1, wherein the light-emitting elements are submillimetre-sized light-emitting rods.

3. The light-emitting module according to claim 2, wherein the set of light-emitting elements comprises a first set of light-emitting elements and a second set of light-emitting elements,
   wherein the light-emitting elements of the first set are supplied with power at a first electrical intensity value by a control circuit; and
   wherein at least two light-emitting elements of the second set are supplied with power by the control circuit at distinct respective luminous intensity values so as to produce said transition.

4. The light-emitting module according to claim 2, wherein the first sub-zone is closer to the first zone than the second sub-zone, and wherein the first density of light-emitting elements in the first sub-zone is higher than the second density of light-emitting elements in the second sub-zone, so as to provide the transition between the first luminous intensity and the second luminous intensity.

5. The light-emitting module according to claim 2, wherein the light-emitting elements are further distributed in a third zone, said second zone being at least partially located between the first zone and the third zone, wherein the third zone emits a third luminous intensity that is equal to or lower than the second luminous intensity.

6. A lighting device for a motor vehicle, comprising the light-emitting module according to claim 2.

7. The light-emitting module according to claim 1, wherein the set of light-emitting elements comprises a first set of light-emitting elements and a second set of light-emitting elements,
- wherein the light-emitting elements of the first set are supplied with power at a first electrical intensity value by a control circuit; and
- wherein at least two light-emitting elements of the second set are supplied with power by the control circuit at distinct respective luminous intensity values so as to produce said transition.

8. The light-emitting module according to claim 7, wherein the electrical power supply of the light-emitting elements of the second set are controllable by the control circuit in such a way as to modify a luminous intensity gradient of said transition.

9. The light-emitting module according to claim 8, further comprising a human-machine interface that is configured to drive the control circuit in such a way as to modify a luminous intensity gradient of said transition.

10. The light-emitting module according to claim 9, wherein the first sub-zone is closer to the first zone than the second sub-zone, and wherein the first density of light-emitting elements in the first sub-zone is higher than the second density of light-emitting elements in the second sub-zone, so as to provide the transition between the first luminous intensity and the second luminous intensity.

11. The light-emitting module according to claim 9, wherein the light-emitting elements are further distributed in a third zone, said second zone being at least partially located between the first zone and the third zone,
- wherein the third zone emits a third luminous intensity that is equal to or lower than the second luminous intensity.

12. The light-emitting module according to claim 8, wherein the first sub-zone is closer to the first zone than the second sub-zone, and wherein the first density of light-emitting elements in the first sub-zone is higher than the second density of light-emitting elements in the second sub-zone, so as to provide the transition between the first luminous intensity and the second luminous intensity.

13. The light-emitting module according to claim 8, wherein the light-emitting elements are further distributed in a third zone, said second zone being at least partially located between the first zone and the third zone,
- wherein the third zone emits a third luminous intensity that is equal to or lower than the second luminous intensity.

14. A lighting device for a motor vehicle, comprising the light-emitting module according to claim 8.

15. The light-emitting module according to claim 7, wherein the first sub-zone is closer to the first zone than the second sub-zone, and wherein the first density of light-emitting elements in the first sub-zone is higher than the second density of light-emitting elements in the second sub-zone, so as to provide the transition between the first luminous intensity and the second luminous intensity.

16. The light-emitting module according to claim 7, wherein the light-emitting elements are further distributed in a third zone, said second zone being at least partially located between the first zone and the third zone,
- wherein the third zone emits a third luminous intensity that is equal to or lower than the second luminous intensity.

17. A lighting device for a motor vehicle, comprising the light-emitting module according to claim 7.

18. The light-emitting module according to claim 1, wherein the first sub-zone is closer to the first zone than the second sub-zone, and wherein the first density of light-emitting elements in the first sub-zone is higher than the second density of light-emitting elements in the second sub-zone, so as to provide the transition between the first luminous intensity and the second luminous intensity.

19. The light-emitting module according to claim 1, wherein the light-emitting elements are further distributed in a third zone, said second zone being at least partially located between the first zone and the third zone,
- wherein the third zone emits a third luminous intensity that is equal to or lower than the second luminous intensity.

20. A lighting device for a motor vehicle, comprising:
a light-emitting module that includes
- at least one light source comprising a set of light-emitting elements;
- the light-emitting elements being distributed in a first zone and in a second zone such that the first zone emits a first luminous intensity and that the second zone provides a transition between the first luminous intensity in proximity to the first zone and a second luminous intensity that is lower than the first luminous intensity,
- wherein the second zone comprises at least a first sub-zone and a second sub-zone that are distinct from one another, a first density of light-emitting elements in the first sub-zone being higher than a second density of light-emitting elements in the second sub-zone.

* * * * *